United States Patent
Jaycox et al.

(10) Patent No.: US 9,248,686 B2
(45) Date of Patent: *Feb. 2, 2016

(54) HIGH RESOLUTION, SOLVENT RESISTANT, THIN ELASTOMERIC PRINTING PLATES

(71) Applicant: E I DU PONT DE NEMOURS AND COMPANY, Wilmington, DE (US)

(72) Inventors: Gary Delmar Jaycox, West Chester, PA (US); Graciela Beatriz Blanchet, Boston, MA (US); Nancy G. Tassi, Gibbstown, NJ (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/030,355

(22) Filed: Sep. 18, 2013

(65) Prior Publication Data

US 2014/0017470 A1 Jan. 16, 2014

Related U.S. Application Data

(62) Division of application No. 12/873,567, filed on Sep. 1, 2010, now Pat. No. 8,563,220.

(51) Int. Cl.
*G03F 7/26* (2006.01)
*B41N 1/12* (2006.01)
*G03F 7/004* (2006.01)
*G03F 7/027* (2006.01)
*G03F 7/033* (2006.01)
*G03F 7/11* (2006.01)

(52) U.S. Cl.
CPC ............... *B41N 1/12* (2013.01); *G03F 7/0046* (2013.01); *G03F 7/027* (2013.01); *G03F 7/033* (2013.01); *G03F 7/11* (2013.01); *Y10T 428/24992* (2015.01); *Y10T 428/3154* (2015.04)

(58) Field of Classification Search
CPC ........................................................ B41N 1/12
See application file for complete search history.

(56) References Cited

U.S. PATENT DOCUMENTS

| 4,264,705 A | 4/1981 | Allen |
| 5,185,234 A | 2/1993 | Nakatsukasa et al. |
| 5,804,353 A * | 9/1998 | Cushner et al. ............... 430/306 |
| 2003/0124454 A1 | 7/2003 | Savariar-Hauck et al. |
| 2007/0098899 A1 | 5/2007 | Wessels et al. |
| 2007/0228893 A1 * | 10/2007 | Yamauchi et al. ............ 310/348 |
| 2008/0000373 A1 | 1/2008 | Petrucci-Samija et al. |
| 2010/0151387 A1 | 6/2010 | Blanchet et al. |
| 2012/0052446 A1 | 3/2012 | Jaycox et al. |

FOREIGN PATENT DOCUMENTS

| EP | 0 536 743 | 10/1992 |
| WO | 9707986 A2 | 3/1997 |
| WO | WO 97-07986 * | 3/1997 |
| WO | 9813730 A1 | 4/1998 |

OTHER PUBLICATIONS

International Search Report dated May 4, 2012, International Application No. PCT/2011/050115.
Antonietti, M. et al., Novel fluorinated block copolymers for the construction of ultra-low energy surfaces and as dispersion stabilizers in solvents with low cohesion energy, Acta Polymer, 1997, pp. 262-268, vol. 48, VCH Verlagsgesellschaft mbH.
Xia, Younan et al., Soft Lithography, Annu. Rev. Mater. Sci., 1998, pp. 153-184, vol. 28, Annual Reviews.

* cited by examiner

*Primary Examiner* — Chanceity Robinson

(57) ABSTRACT

The present invention relates to a printing element having at least one polymer layer which has photoimageable constituents and a chemically functionalized polymer to make the polymer layer either more hydrophobic or hydrophilic. In one embodiment, the printing element comprises two adjacent polymer layers on a substrate in which the photoimaged layer comprises a polymer chemically modified with hydrophobic fluoroalkyl side groups to provide differential wetting with hydrophilic inks.

12 Claims, No Drawings

HIGH RESOLUTION, SOLVENT RESISTANT, THIN ELASTOMERIC PRINTING PLATES

CROSS-REFERENCE TO RELATED APPLICATIONS

Subject matter disclosed herein is disclosed and claimed in the following copending applications, filed contemporaneously herewith and assigned to the assignee of the present invention:
HIGH RESOLUTION, SOLVENT RESISTANT, THIN ELASTOMERIC PRINTING PLATES U.S. Ser. No. 12/873, 584.

FIELD OF THE INVENTION

The present invention relates to a printing element comprising at least one polymer layer on a substrate which has photoimageable constituents and a chemically functionalized polymer to make the polymer layer either more hydrophobic or hydrophilic.

BACKGROUND

M. Antonietti, et al (Acta Polymer 1997, 48, 262) describes the chemical modification of styrene-butadiene-styrene copolymers, but their resulting materials were not used to prepare elastomeric printing plates.

U.S. Pat. No. 4,264,705 discloses a multilayered printing plate for flexographic printing prepared from unmodified elastomeric polymers. However, relief feature depths are very large precluding high resolution printing applications.

A variety of soft lithographic techniques have been developed for high resolution printing applications (US 2007/0098899; Xia, Y; Whitesides, G. M. Annu. Rev. Mater. Sci. 1998, 28, 153). However, these methods typically utilize mechanically fragile elastomeric stamps based on PDMS (polydimethylsiloxane) and are not suitable for large scale reel-to-reel printing processes.

In contrast, the present invention is directed to an article comprising at least one layer an elastomeric polymer deposited on a substrate wherein the polymer is photoimageable and has been chemically modified to contain either hydrophobic fluoroalkyl side groups or hydrophilic hydroxyl side groups to provide differential wetting with hydrophilic inks.

SUMMARY OF THE INVENTION

The present invention is directed to an article comprising:
a) a hydrophilic substrate;
b) a semi-interpenetrating polymer network layer disposed on the substrate, wherein the network layer comprises: a hydrophobic fluorinated crosslinked polymer and a hydrophobic fluorinated elastomeric polymer.

The invention is further directed to an article comprising:
a) a substrate;
b) a bi-layer having a first layer and a second layer of semi-interpenetrating polymer network layers disposed on the substrate, wherein the first network layer comprises a hydrophobic fluorinated crosslinked polymer and a hydrophobic fluorinated elastomeric polymer; and the second network layer comprises a crosslinked polymer and a elastomeric polymer.

DETAILED DESCRIPTION

In a standard imaged and processed flexographic printing plate, the step height ($\Delta h$) between the uppermost relief features and the floor of the plate typically ranges from about 100-500 microns. This dimension depends upon the desired size of the relief features and on other specifics unique to the printing plate. When plates are intended to be used for high resolution printing applications (i.e. printing in the micron range), the value of $\Delta h$ must be reduced so as to be comparable to the plate's very small feature sizes. Typically, the $\Delta h$-to-feature size ratio falls near unity for most high resolution printing processes. Unfortunately, the reduction in $\Delta h$ tends to compromise the plate's mechanical durability and its elastomeric performance that is required for good conformal contact with the object to be printed. One solution to this limitation involves the fabrication of a bi-layer construct that has both a thermo- (or a photo-) crosslinkable elastomeric floor layer providing for good mechanical properties and a thin photo-imageable elastomeric layer that is sequentially deposited on top that contains the desired relief features arranged in a pattern. In this way, the properties of the two layers can each be optimized separately so that the bottom layer adjacent to the substrate controls the plate's elastic modulus for optimal printing performance while the thin upper layer (with $\Delta h\sim$desired feature size) maximizes the plate's printing resolution.

Bi-layer plates that are fabricated in this manner can be designed for differential inking with hydrophilic inks that utilize water or aqueous alcohols as their vehicles. Here, the printing plate comprises a flexible support or substrate layer and two additional crosslinkable elastomeric layers that have been chemically designed to have different surface energies relative to one another. Both of these additional layers would comprise elastomeric photopolymer compositions where one of the layers contains an elastomeric polymer that has been chemically modified with hydrophobic fluoroalkyl side groups or with hydrophilic hydroxyl side groups. Alternately, both of the additional layers could be chemically modified such that one layer contains an elastomeric polymer fitted with hydrophobic fluoroalkyl side groups while the adjacent layer contains an elastomeric polymer containing hydrophilic hydroxyl side groups to maximize the surface energy contrast between the two elastomeric layers.

The more hydrophobic fluorinated elastomer can reside in either the lower layer or in the photo-imageable upper layer of the bi-layer printing plate. If the fluorine containing layer is at the top, then the bottom layer would selectively ink with hydrophilic inks (Gravure mode). On the other hand, if the fluorine modified layer is at the bottom, then the upper photo-imaged layer would selectively ink when hydrophilic inks are used (flexographic mode). In either of these cases, good printing resolution is achieved because the relatively more hydrophobic fluorinated portions of the plate are not wetted by the hydrophilic ink while the other more hydrophilic areas are wetted by the ink.

Gravure or flexographic bi-layer printing plates that can be selectively inked with hydrophobic inks could also be fabricated in a similar manner. In this case, both layers of the bi-layer plate would also comprise crosslinked elastomeric photopolymer compositions and one of the layers would also contain elastomeric polymers chemically modified with hydrophilic hydroxyl side groups. If the upper layer contained the hydroxyl modified elastomer, then the bottom layer of the bi-layer plate would selectively ink when contacted by hydrophobic inks (Gravure mode). Conversely, if the hydrophilic layer is at the bottom, then the upper layer of the plate would selectively ink when hydrophobic inks are employed (flexographic mode). Again, good printing resolution is achieved because the relatively more hydrophilic portions of the bi-layer plate are not wetted by the hydrophobic ink while the other more hydrophobic areas of the plate are wetted by the ink.

Depending upon the particular application desired, the target resolution for high resolution printing plates is typically in the range of 1-15 microns. Reel-to-reel printing of electronic devices requires the patterning of individual lines and spaces at high resolutions. In particular, the source-drain level of a thin film transistor is especially demanding because the channel lengths required for good transistor performances are on the order of only a few microns. Currently it is not possible to print at these micron resolutions using available materials and/or processes. Standard printing plates do not have nearly the required resolution. In contrast, molded polydimethylsiloxane (PDMS) printing plates or stamps can reach these resolutions but are mechanically fragile and are generally limited to printing thiol-containing liquids and inks.

The bi-layer plates described herein are fabricated from commercially available block copolymers like poly(styrene-butadiene-styrene) or poly(styrene-isoprene-styrene) elastomers. These elastomers are mechanically robust materials that can be chemically modified with either hydrophobic fluoroalkyl side chains or hydrophilic hydroxyl side groups to alter their surface wetting behaviors. Olefinic double bonds present within the "soft" butadiene or isoprene segments serve as convenient sites for chemical modification. The chemically modified elastomers can be mixed or blended with smaller crosslinkable acrylate or methacrylate monomers to give polymerizable compositions that furnish robust, semi-interpenetrating networks (SIPNs) when crosslinked thermally or photo-chemically. The SIPN layers that result are elastomeric in their mechanical behavior and form at least one of the two working layers in the bi-layer plate wherein the at least one of the working layers contain the chemically modified elastomer to modify its surface energy relative to the other layer. The SIPN layer formed in this manner is chemically resistant to many solvents and dispersants that are used in standard ink formulations, including ethanol, aqueous alcohol mixtures, toluene and ortho-dichlorobenzene. The SIPN layer has an elastic modulus in the range of 10 to 100 MPa (megapascals), preferably 20 to 40 MPa. When two layers of the bi-layer are SIPN layers and contain many of the same chemical components, inter-layer adhesion between the two adjacent layers is maintained. In addition to poly(styrene-butadiene-styrene) or poly(styrene-isoprene-styrene) elastomers, other chemically modifiable, elastomeric polymers and rubbers can also be used to form the polymeric SIPN layers in the bi-layer plate, including various copolymers of butadiene with acrylonitrile and some neoprene rubbers.

One embodiment of the present invention is an article which may be used as a printing element. In this embodiment, the flexible supporting substrate is selected to be relatively hydrophilic. The substrate may be Mylar (DuPont Teijin Films, Bristol, UK). A single, relatively hydrophobic polymer layer is deposited onto the substrate. The polymer layer may be deposited by spin coating, bar coating, spraying, dipping or similar coating technologies known to one skilled in the art. The polymer layer comprises an elastomeric block copolymer of styrene-butadiene-styrene or styrene-isoprene-styrene that has been chemically modified with fluoroalkyl side groups along with separate photoimaging constituents. Appropriate photoimaging constituents may include photoinitiators and/or photosensitizers among others. The polymer layer also comprises a polymer of the monomers selected from the group consisting of:

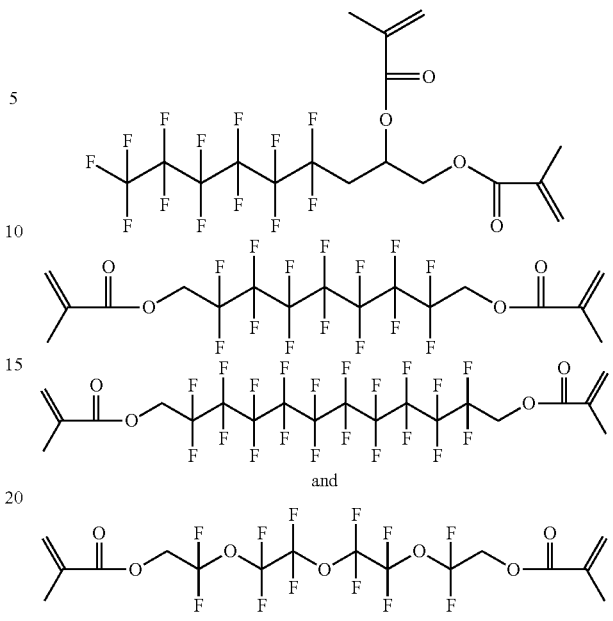

and mixtures thereof. In this embodiment, the substrate is relatively hydrophilic while the photo-imaged polymer layer is hydrophobic due, in part, to the presence of fluoroalkyl side groups chemically attached to the styrene-butadiene-styrene or styrene-isoprene-styrene copolymer backbone.

A another embodiment is an article which may be used as a printing element. In this embodiment, the substrate is selected to be relatively hydrophobic. The substrate may be plasma treated polytetrafluoroethylene or another plasma treated fluoropolymer. A polymer layer is deposited on the substrate. The polymer layer comprises an elastomeric block copolymer of styrene-butadiene-styrene or styrene-isoprene-styrene that has been chemically modified to contain hydrophilic side groups along with separate photoimaging constituents. Appropriate photoimaging constituents may include photoinitiators and/or photosensitizers among others. The polymer layer further comprises a polymer of non-fluorinated (meth)acrylate monomers that may optionally contain hydrophilic substituents such as hydroxyl or carboxylic acid groups. The non-fluorinated (meth)acrylate monomers may be trimethylolpropane triacrylate (TMPTA), ethoxylated trimethylolpropane triacrylate (TMPEOTA) and/or 1,12-dodecanediol dimethacrylate (Sartomer CD262). In this embodiment, the substrate is hydrophobic while the photo-imaged polymer layer is relatively hydrophilic due to the presence of hydroxyl side groups chemically attached to the styrene-butadiene-styrene or styrene-isoprene-styrene copolymer backbone.

In another embodiment is an article which may be used as a printing element. In this embodiment, the substrate may be any material that can be coated. A first polymer layer is deposited on the substrate. The first polymer layer may be deposited by any known coating technique. The first polymer layer comprises an elastomeric block copolymer of styrene-butadiene-styrene or styrene-isoprene-styrene that has been chemically modified with hydrophobic fluoroalkyl side groups and a separate initiator. The initiator may be Irgacure® 907 (2-Methyl-1-[4-(methylthio)phenyl]-2-(4-morpholinyl)-1-propanone) (Ciba Specialty Chemicals, Basel, Switzerland). The first polymer layer further comprises a polymer of the monomers selected from the group consisting of:

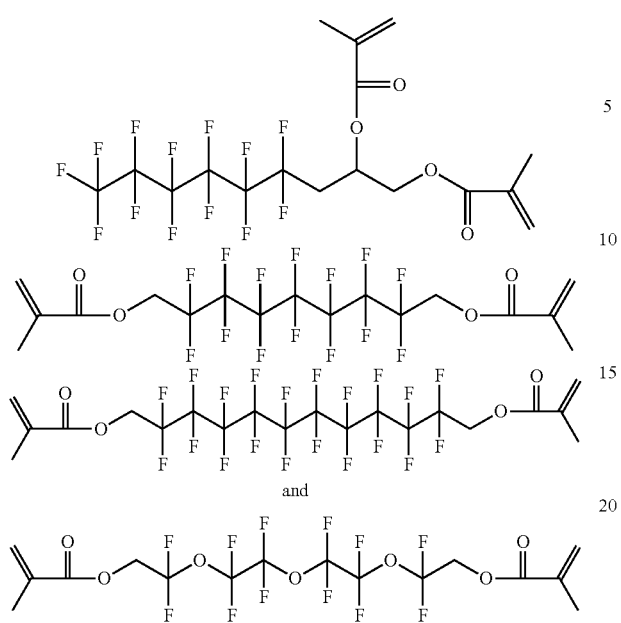

and mixtures thereof. A second polymer layer is deposited onto the first polymer layer. The second polymer layer comprises an elastomeric block copolymer of styrene-butadiene-styrene or styrene-isoprene-styrene, optionally containing hydrophilic hydroxyl side groups, along with separate photoimaging constituents. Appropriate photoimaging constituents may include photoinitiators and/or photosensitizers among others. The second layer further comprises a polymer of non-fluorinated acrylate or methacrylate crosslinking monomers, optionally containing hydrophilic substituents. The non-fluorinated (meth)acrylate monomers may be trimethylolpropane triacrylate (TMPTA), ethoxylated trimethylolpropane triacrylate (TMPEOTA) and/or 1,12-dodecanediol dimethacrylate (Sartomer CD262).). In this embodiment, the lower polymer layer is hydrophobic due to the presence of fluoroalkyl groups while the photo-imaged upper polymer layer is relatively hydrophilic. In an embodiment, the lower polymer layer is identified as the first network layer and is adjacent to the substrate and the upper polymer layer is identified as the second network layer.

Another embodiment is an article which may be used as a printing element. In this embodiment, the substrate may be any material which may be coated. A first polymer layer is deposited on the substrate. The first polymer layer may be deposited by any known coating technique. The first polymer layer comprises an elastomeric block copolymer of styrene-butadiene-styrene or styrene-isoprene-styrene, optionally containing hydrophilic hydroxyl side groups and a separate initiator. The initiator may be Irgacure® 907 (Ciba Specialty Chemicals, Basel, Switzerland). The first polymer layer also comprises a polymer of non-fluorinated acrylate or methacrylate crosslinking monomers. The non-fluorinated (meth)acrylate monomers may be trimethylolpropane triacrylate (TMPTA), ethoxylated trimethylolpropane triacrylate (TMPEOTA) and/or 1,12-dodecanediol dimethacrylate (Sartomer CD262). A second polymer layer is deposited onto the first polymer layer. The second polymer layer comprises an elastomeric block copolymer of styrene-butadiene-styrene or styrene-isoprene-styrene that has been chemically modified with hydrophobic fluoroalkyl side groups along with photoimaging constituents. Appropriate photoimaging constituents may include photoinitiators and/or photosensitizers among others. The second polymer layer further comprises a polymer of the monomers selected from the group consisting of:

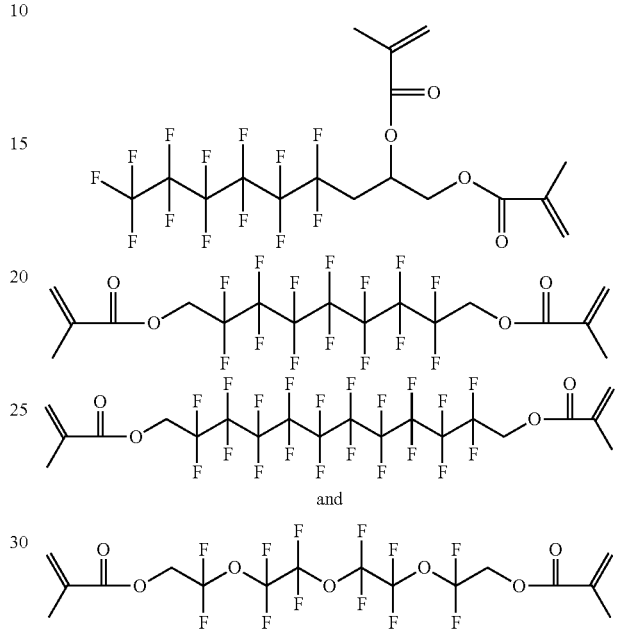

and mixtures thereof. In this embodiment, the lower polymer layer is relatively hydrophilic while the photo-imaged upper polymer layer is relatively hydrophobic due to the presence of fluoroalkyl groups.

A fifth embodiment of the present invention is an article which may be used as a printing element. In this embodiment, the substrate may be any material which may be coated. A first polymer layer is deposited on the substrate. The first polymer layer may be deposited by any known coating technique. The first polymer layer comprises an elastomeric block copolymer of styrene-butadiene-styrene or styrene-isoprene-styrene and a separate initiator. The initiator may be Irgacure® 907 (Ciba Specialty Chemicals, Basel, Switzerland). The first polymer layer also comprises a polymer of non-fluorinated acrylate or methacrylate crosslinking monomers. The non-fluorinated (meth)acrylate monomers may be trimethylolpropane triacrylate (TMPTA), ethoxylated trimethylolpropane triacrylate (TMPEOTA) and/or 1,12-dodecanediol dimethacrylate (Sartomer CD262). A second polymer layer is deposited onto the first polymer layer. The second polymer layer comprises an elastomeric block copolymer of styrene-butadiene-styrene or styrene-isoprene-styrene that has been chemically modified with hydrophobic fluoroalkyl side groups along with photoimaging constituents. Appropriate photoimaging constituents may include photoinitiators and/ or photosensitizers among others. The second polymer layer further comprises a polymer of the monomers selected from the group consisting of:

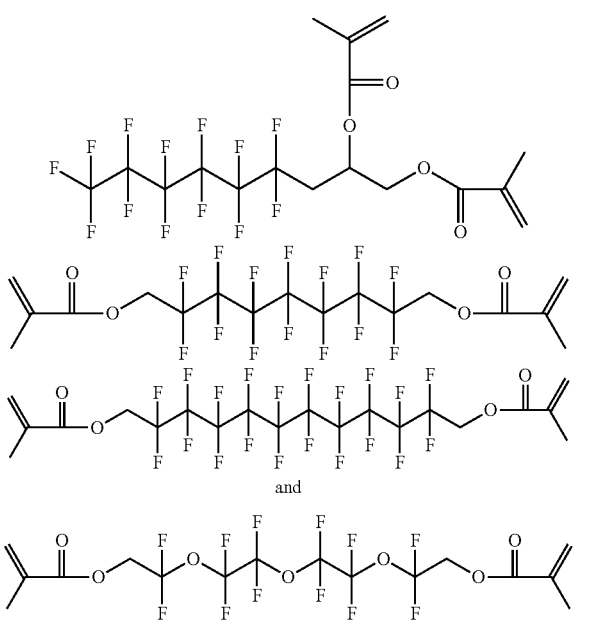

and mixtures thereof. In this embodiment, the lower polymer layer is relatively hydrophilic while the photo-imaged upper polymer layer is relatively hydrophobic due to the presence of fluoroalkyl groups.

A sixth embodiment of the present invention is an article which may be used as a printing element. In this embodiment, the substrate may be any material which may be coated. A first polymer layer is deposited on the substrate. The first polymer layer may be deposited by any known coating technique. The first polymer layer comprises an elastomeric block copolymer of styrene-butadiene-styrene or styrene-isoprene-styrene and a separate initiator. The initiator may be Irgacure® 907 (Ciba Specialty Chemicals, Basel, Switzerland). The first polymer layer also comprises a polymer of non-fluorinated acrylate or methacrylate crosslinking monomers. The non-fluorinated (meth)acrylate monomers may be trimethylolpropane triacrylate (TMPTA), ethoxylated trimethylolpropane triacrylate (TMPEOTA) and/or 1,12-dodecanediol dimethacrylate (Sartomer CD262). A second polymer layer is deposited onto the first polymer layer. The second polymer layer comprises an elastomeric block copolymer of styrene-butadiene-styrene or styrene-isoprene-styrene that has been chemically modified with hydrophilic hydroxyl side groups along with photoimaging constituents. Appropriate photoimaging constituents may include photoinitiators and/or photosensitizers among others. The second polymer layer also comprises a polymer of non-fluorinated acrylate or methacrylate crosslinking monomers. The non-fluorinated (meth)acrylate monomers may be trimethylolpropane triacrylate (TMPTA), ethoxylated trimethylolpropane triacrylate (TMPEOTA) and/or 1,12-dodecanediol dimethacrylate (Sartomer CD262). In this embodiment, the lower polymer layer is relatively hydrophobic while the photo-imaged upper polymer layer is relatively hydrophilic due to the presence of hydroxyl side groups chemically attached to the styrene-butadiene-styrene or styrene-isoprene-styrene copolymer backbone.

The present invention is also a process to make printing elements. In one embodiment, a substrate is provided. The substrate may be Melinex® ST504 (DuPont Teijin Films, Bristol, UK). The next step in the process is depositing a layer on the substrate. The layer may be deposited by any known coating technique. The layer comprises a block copolymer of styrene-butadiene-styrene or styrene-isoprene-styrene that contains hydrophobic fluoroalkyl side groups, a photo-initiator and fluorinated crosslinking monomers selected from the group consisting of:

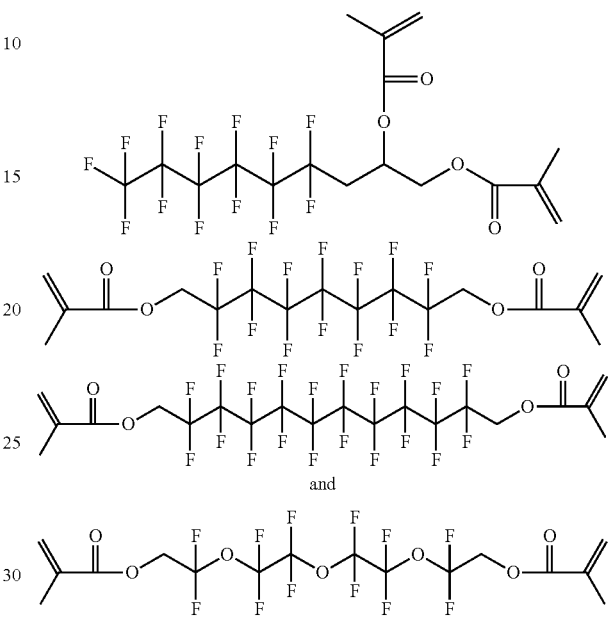

and mixtures thereof. The photoinitiator may be Irgacure® 907 (Ciba Specialty Chemicals, Basel, Switzerland). The next step in the process is irradiating an image into the layer and then developing the irradiated image by exposing the irradiated layer to a developing solution which dissolves the non-irradiated, non-crosslinked portions from the exposed image.

In a second process embodiment, a substrate is provided. The substrate may be plasma treated polytetrafluoroethylene or another plasma treated fluoropolymer. The next step in the process is depositing a layer on the substrate. The layer may be deposited by any known coating technique. The layer comprises a block copolymer of styrene-butadiene-styrene or styrene-isoprene-styrene chemically modified with hydrophilic hydroxyl side groups, a photo-initiator and non-fluorinated crosslinking acrylate or methacrylate monomers. The non-fluorinated (meth)acrylate monomers may be TMPTA, TMPEOTA and/or Sartomer CD262. The photoinitiator may be Irgacure® 907 (Ciba Specialty Chemicals, Basel, Switzerland). The next step in the process is irradiating an image into the layer and then developing the irradiated image by exposing the irradiated layer to a developing solution which dissolves the non-irradiated, non-crosslinked portions from the exposed image.

In a third process embodiment, a substrate is provided. The substrate may be Melinex® ST504 (DuPont Teijin Films, Bristol, UK). The next step in the process is depositing a first layer on the substrate. The first layer may be deposited by any known coating technique. The first layer comprises a block copolymer of styrene-butadiene-styrene or styrene-isoprene-styrene that contains hydrophobic fluoroalkyl side chains, an initiator and fluorinated monomers selected from the group consisting of:

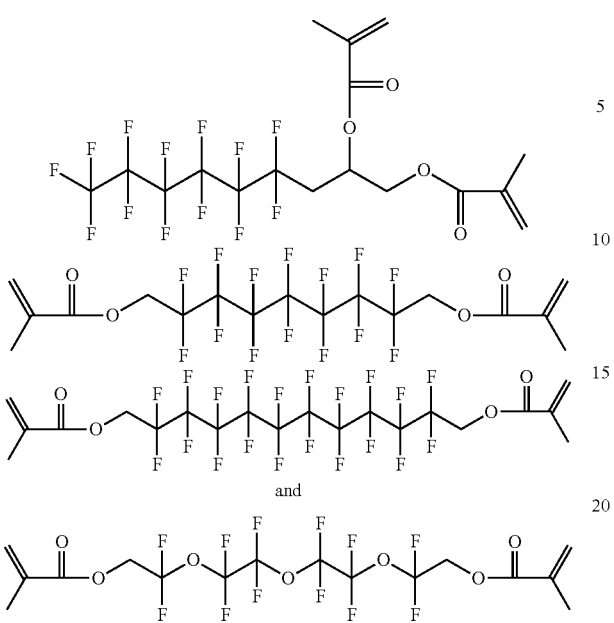

and mixtures thereof. The initiator may be di(4-tert-butylcyclohexyl) peroxydicarbonate, Perkadox® 16 (Akzo Nobel) or Irgacure® 907 (Ciba Specialty Chemicals, Basel, Switzerland). The next step in the process is crosslinking the first layer. The crosslinking step may be thermal or, if the initiator is a photoinitiator, the crosslinking step may be by flood irradiation. In the next step of the process, a second layer is deposited onto the first polymer layer. The second layer may be deposited by any known coating technique. The second layer comprises a block copolymer of styrene-butadiene-styrene or styrene-isoprene-styrene, optionally containing hydrophilic hydroxyl side groups, a photoinitiator and non-fluorinated crosslinking acrylate or methacrylate monomers. The non-fluorinated (meth)acrylate monomers may be TMPTA, TMPEOTA and/or Sartomer CD262. The photoinitiator may be Irgacure® 907 (Ciba Specialty Chemicals, Basel, Switzerland). The subsequent step in the process is irradiating an image into the second layer. The next step is developing the irradiated image by exposing the second polymer layer to a developing solution which dissolves the non-irradiated, non-crosslinked portions from the exposed image.

In a fourth process embodiment, a substrate is provided. The substrate may be Melinex® ST504 (DuPont Teijin Films, Bristol, UK). The next step in the process is depositing a first layer on the substrate. The first layer may be deposited by any known coating technique. The first layer comprises a block copolymer of styrene-butadiene-styrene or styrene-isoprene-styrene, optionally containing hydrophilic hydroxyl side groups, an initiator and non-fluorinated crosslinking acrylate or methacrylate monomers. The non-fluorinated (meth)acrylate monomers may be TMPTA, TMPEOTA and/or Sartomer CD262. The initiator may be di(4-tert-butylcyclohexyl) peroxydicarbonate, Perkadox® 16 (Akzo Nobel) or Irgacure® 907 (Ciba Specialty Chemicals, Basel, Switzerland). The next step in the process is crosslinking the first layer. The crosslinking step may be thermal or, if the initiator is a photoinitiator, the crosslinking step may be by flood irradiation. In the next step of the process, a second layer is deposited onto the first polymer layer. The second layer may be deposited by any known coating technique. The second layer comprises a block copolymer of styrene-butadiene-styrene or styrene-isoprene-styrene that contains hydrophobic fluoroalkyl side chains, a photo-initiator and fluorinated monomers selected from the group consisting of:

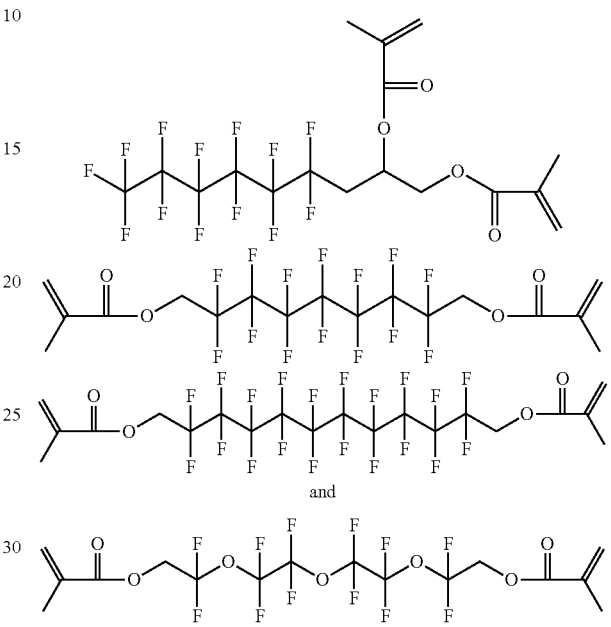

and mixtures thereof. The photoinitiator may be Irgacure® 907 (Ciba Specialty Chemicals, Basel, Switzerland). The subsequent step in the process is irradiating an image into the second layer; where the irradiation takes place on the second layer an imaged crosslinked polymer pattern is formed and where areas of the second layer is not irradiated a non-crosslinked polymer pattern is formed. The next step is developing the second polymer layer with a developing solution which dissolves the non-irradiated, non-crosslinked portions of the image.

In a fifth process embodiment, a substrate is provided. The substrate may be Melinex® ST504 (DuPont Teijin Films, Bristol, UK). The next step in the process is depositing a first layer on the substrate. The first layer may be deposited by any known coating technique. The first layer comprises a block copolymer of styrene-butadiene-styrene or styrene-isoprene-styrene, an initiator and non-fluorinated crosslinking acrylate or methacrylate monomers. The non-fluorinated (meth)acrylate monomers may be TMPTA, TMPEOTA and/or Sartomer CD262. The initiator may be di(4-tert-butylcyclohexyl) peroxydicarbonate, Perkadox® 16 (Akzo Nobel) or Irgacure® 907 (Ciba Specialty Chemicals, Basel, Switzerland). The next step in the process is crosslinking the first layer. The crosslinking step may be thermal or, if the initiator is a photoinitiator, the crosslinking step may be by flood irradiation. In the next step of the process, a second layer is deposited onto the first polymer layer. The second layer may be deposited by any known coating technique. The second layer comprises a block copolymer of styrene-butadiene-styrene or styrene-isoprene-styrene that contains hydrophobic fluoroalkyl side chains, a photo-initiator and fluorinated monomers selected from the group consisting of:

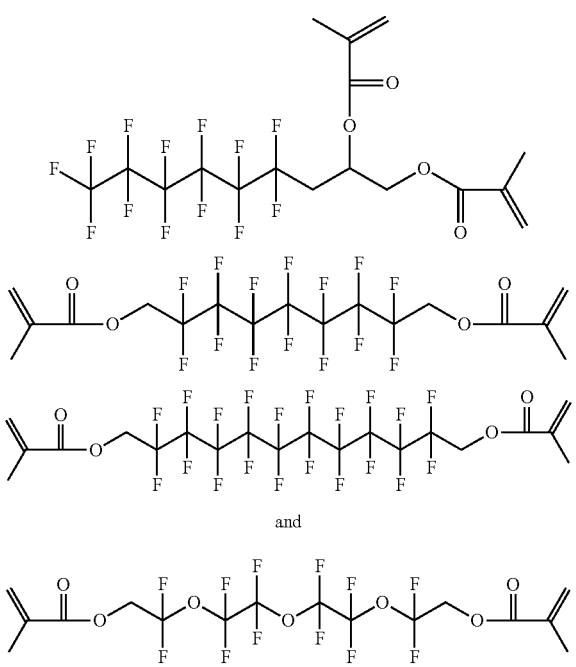

and mixtures thereof. The photoinitiator may be Irgacure® 907 (Ciba Specialty Chemicals, Basel, Switzerland). The subsequent step in the process is irradiating an image into the second layer. The next step is developing the irradiated image by exposing the second polymer layer to a developing solution which dissolves the non-irradiated, non-crosslinked portions from the exposed image.

In a sixth process embodiment, a substrate is provided. The substrate may be Melinex® ST504 (DuPont Teijin Films, Bristol, UK). The next step in the process is depositing a first layer on the substrate. The first layer may be deposited by any known coating technique. The first layer comprises a block copolymer of styrene-butadiene-styrene or styrene-isoprene-styrene, an initiator and non-fluorinated crosslinking acrylate or methacrylate monomers. The non-fluorinated (meth)acrylate monomers may be TMPTA, TMPEOTA and/or Sartomer CD262. The initiator may be di(4-tert-butylcyclohexyl) peroxydicarbonate, Perkadox® 16 (Akzo Nobel) or Irgacure® 907 (Ciba Specialty Chemicals, Basel, Switzerland). The next step in the process is crosslinking the first layer. The crosslinking step may be thermal or, if the initiator is a photoinitiator, the crosslinking step may be by flood irradiation. In the next step of the process, a second layer is deposited onto the first polymer layer. The second layer may be deposited by any known coating technique. The second layer comprises a block copolymer of styrene-butadiene-styrene or styrene-isoprene-styrene containing hydrophilic hydroxyl side groups, a photoinitiator and non-fluorinated crosslinking acrylate or methacrylate monomers. The non-fluorinated (meth)acrylate monomers may be TMPTA, TMPEOTA and/or Sartomer CD262. The photoinitiator may be Irgacure® 907 (Ciba Specialty Chemicals, Basel, Switzerland). The subsequent step in the process is irradiating an image into the second layer. The next step is developing the irradiated image by exposing the second polymer layer to a developing solution which dissolves the non-irradiated, non-crosslinked portions from the exposed image.

EXAMPLES

Example 1

Preparation of 10%-hydroxylated styrene-butadiene-styrene copolymer (SBS-OH)

A solution of Kraton D1184K SBS block copolymer (Kraton Polymers LLC, Houston, Tex.) (26.0 g, 0.337 mol of reactive double bond) dissolved in anhydrous tetrahydrofuran (500 mL) was purged with argon for twelve hours and then treated dropwise with a 0.50 M solution of 9-borabicyclo-[3.3.1]nonane in tetrahydrofuran (68 mL, 0.034 mol). Once the addition was complete, the reaction mixture was heated to reflux for 24 hours under argon and then cooled to 0 degrees C. with an ice bath. The reaction mixture was next treated with 6N sodium hydroxide solution (7.3 mL) followed by the slow addition of a 30% aqueous solution of hydrogen peroxide (15 mL) and then heated to reflux for an additional 24 hours. The resulting mixture was concentrated in vacuo, giving a crude polymeric solid that was redissolved into tetrahydrofuran (100 mL). The polymeric product was re-isolated by pouring the tetrahydrofuran solution into water (500 mL). Two additional tetrahydrofuran-water dissolution-precipitation steps were used to obtain the desired product in purified form. The copolymer was then dried in vacuo at 40 degrees C. for 48 hours to give a white, elastomeric solid. The product was stored in the dark under an argon atmosphere. Analysis of the product by FTIR revealed a broad peak centered near 3329 $cm^{-1}$ consistent with the incorporation of hydroxyl groups within the copolymer's backbone.

Example 2

Preparation of 10%-fluoroalkylated styrene-butadiene-styrene copolymer (SBS-F)

A solution of 10% hydroxylated SBS copolymer (3.5 g, 4.5 mmol reactive OH group) dissolved in anhydrous tetrahydrofuran (250 mL) was treated first with pyridine (0.72 g, 9.1 mmol) followed by pentadecafluorooctanoyl chloride (2.08 g, 4.81 mmol). The resulting solution was stirred under argon at room temperature for one hour and then heated to a mild reflux for an additional 24 hours. The reaction mixture was poured into water (500 mL), immediately giving a white precipitate. The crude product was redissolved into tetrahydrofuran (200 mL) and then reprecipitated into water. Two additional tetrahydrofuran-water dissolution-precipitation steps were used to obtain the desired product in purified form. The fluoroalkylated copolymer was then dried in vacuo at 40 degrees C. for 48 hours to give a white, elastomeric solid. The product was stored in the dark under an argon atmosphere. Analysis of the product by FTIR revealed the absence of a broad peak centered near 3329 $cm^{-1}$ consistent with the esterification of the reactive hydroxyl groups within the copolymer's backbone. An additional signal near 1780 $cm^{-1}$ (ester carbonyl stretch) was also observed.

Example 3

This example illustrates how the chemical modification of styrene-butadiene-styrene copolymers influenced their surface wetting characteristics when the copolymers were examined in thin film form.

The unmodified styrene-butadiene-styrene copolymer (SBS) along with the hydroxylated (SBS-OH) product described in Example 1 and the fluoroalkylated product (SBS-F) described in Example 2 were each dissolved into methylisobutyl ketone to give three separate solutions at 10 weight percent concentrations. Each solution was then spin coated onto a cleaned glass slide at 1000 RPM for 60 seconds. The resulting elastomeric films were dried in a vacuum oven at room temperature for 24 hours. The surface wetting characteristics of the three films were then evaluated by dynamic contact angle measurements using a VCA2500xe instrument manufactured by AST Products (Billerica, Mass.). Distilled water was employed as the wetting fluid. These results provided in Table 1 indicate that the wetting characteristics of the SBS films were strongly impacted the chemical modification process, with the fluoroalkylated copolymer (SBS-F) presenting the most hydrophobic surface and the hydroxylated copolymer (SBS-OH) exhibiting the most hydrophilic surface. The unmodified Kraton SBS copolymer possessed a wetting behavior that was intermediate between those exhibited by the two chemically modified SBS copolymers.

TABLE 1

| Copolymer | Measured Contact Angle (Water) | |
| --- | --- | --- |
|  | advancing (deg) | receding (deg) |
| SBS-F | 120 | 83 |
| SBS | 103 | 77 |
| SBS-OH | 97 | 54 |

Example 4

The following example illustrates the ability to selectively ink only the desired areas of a bi-layer plate operating in a flexo mode (top layer is wetted by hydrophilic ink while the bottom layer is similarly not wetted). Bilayer printing plates were fabricated on the acrylic side of a clean sheet of ST504 Melinex base (DuPont Teijin Films, Bristol, UK). The base was cleaned with a methanol rinse, followed by sequential DI water and isopropyl alcohol rinses. After a final rinse with DI water, the base was thoroughly dried using a high pressure nitrogen gun. The two separate formulations (composition A and composition B) containing two different chemically modified SBS copolymers were mixed overnight at room temperature and then filtered through 1.5 um GMF filters.

Composition A:
78.5 wt % 10%-fluoroalkylated SBS copolymer (dissolved at 10 weight percent in methylisobutyl ketone)
14 wt % fluorinated dimethacrylate:

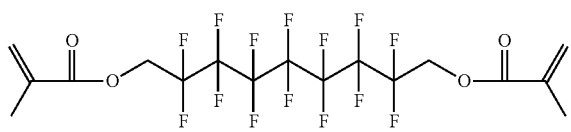 [SMILES: C=C(C)C(=O)OCC(F)(F)C(F)(F)C(F)(F)C(F)(F)C(F)(F)C(F)(F)C(F)(F)COC(=O)C(=C)C]

5 wt % pentafluorostyrene
2 wt % glycidyl methacrylate
0.5 wt % Irgacure 907
Composition B:
78.5 wt % 10%-hydroxylated SBS copolymer (dissolved at 10 weight percent in methylisobutyl ketone)
11 wt % CD262
4 wt % TMPEOTA
4 wt % TMPTA
2 wt % Glycidyl methacrylate
0.5 wt % Irgacure 907

A bottom layer with composition A was spin-coated onto the Melinex base at 1000 RPM for 60 seconds. After the spin-coating process was complete, the coated substrate was flood-exposed with an OAI 345 nm i-liner for 10 minutes under a nitrogen atmosphere to crosslink the film. A second layer having composition B was spin-coated onto the crosslinked bottom layer at 1000 RPM for 60 seconds. The newly coated layer was dried in a nitrogen atmosphere for 2 minutes and then exposed through a clear-field photomask to an i-liner at 345 nm for 65 seconds. The upper layer was developed in methylisobutyl ketone for 2 minutes during which time unexposed regions of the film were dissolved away. The patterned upper layer was thoroughly dried by using a high pressure nitrogen gun.

The resulting bilayer plates were wetted with a Ag nanoink DGP40 (Advanced NanoProducts, Seoul, Korea) diluted 1:5 with ethanol. The ink was spin-coated onto the plate at 1000 RPM. The inked plates were then observed in an optical microscope and areas that inked and did not ink were determined. The results showed differential wetting by the hydrophilic silver ink formulation, with the ink residing on the more hydrophilic, upper portions of the bilayer plate.

The fluorinated dimethacrylate used to prepare the bottom layer with composition A was synthesized as follows: A solution of 1H,1H,9H,9H-perfluoro-1,9-nonanediol (19.1 g, 46.3 mmol) and methacrylic anhydride (57.1 g, 370 mmol) in tetrahydrofuran (150 mL) was treated with sodium acetate (0.20 g) and 4-methoxyphenol (100 ppm). The resulting mixture was heated to reflux under a dried-air atmosphere for 48 hours and then cooled to room temperature. The tetrahydrofuran solvent was carefully removed under reduced pressure. The concentrated reaction mixture that remained was next diluted with ethyl ether (200 mL) and the resulting solution was rapidly stirred with 2% aqueous sodium carbonate (200 mL) for several hours to hydrolyze excess methacrylic anhydride reagent. The organic phase was separated and then sequentially washed with 2% sodium carbonate (100 mL), water (3×100 mL) and brine (50 mL). The organic phase was dried over anhydrous sodium sulfate, treated with 4-methoxyphenol (100 ppm) and then concentrated in vacuo to afford a clear, semi-viscous oil in 91% yield. Analysis of the product by FTIR revealed the absence of OH stretching near 3400 cm-1 and the presence of new signals at 1742 cm-1 (ester carbonyl) and 1638 cm-1 (methacrylate double bond). Proton NMR (CDCl3) spectroscopy confirmed the presence of terminal methacrylate groups in the product with resonances appearing near 6.2 and 5.8 ppm (methacrylate double bond) and 1.9 ppm (methacrylate methyl group). Theoretical fluorine-to-carbon ratio=0.82

Example 5

The following example illustrates the ability to selectively ink only the desired areas of a bi-layer plate operating in a gravure mode (bottom layer is wetted by hydrophilic ink while the top layer is not wetted). Bilayer printing plates were fabricated on the acrylic side of a clean sheet of ST504 Melinex base (DuPont Teijin Films, Bristol, UK). The base was cleaned with a methanol rinse, followed by sequential DI water and isopropyl alcohol rinses. After a final rinse with DI water, the base was thoroughly dried using a high pressure nitrogen gun. The two separate formulations (composition A and composition B) containing different SBS copolymers were mixed overnight at room temperature and then filtered through 1.5 um GMF filters.

Composition A:

73.5 wt % Kraton DKX222CS SBS copolymer (dissolved at 10 weight percent in methylisobutyl ketone)

19.5 wt % TMPEOTA 2 wt % glycidyl methacrylate 5 wt % Perkadox 16

Composition B:

80.5 wt % 10%-fluoroalkylated SBS copolymer (dissolved at 10 weight percent in methylisobutyl ketone)

14 wt % fluorinated dimethacrylate:

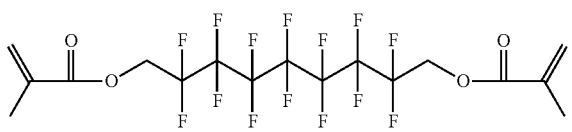 [SMILES: C=C(C)C(=O)OCC(F)(F)C(F)(F)C(F)(F)C(F)(F)C(F)(F)C(F)(F)C(F)(F)COC(=O)C(=C)C]

5 wt % pentafluorostyrene 0.5 wt % Irgacure 907

A bottom layer with composition A was bar-coated onto the Melinex base. The coating thickness was near 10 microns. After the solvent was allowed to evaporate, the coated substrate was thermally crosslinked under vacuum with a slight nitrogen purge. A second layer having composition B was then spin-coated onto the crosslinked bottom layer at 1000 RPM for 60 seconds. The newly coated layer was dried in a nitrogen atmosphere for 2 minutes and then exposed through a clear-field photomask to an i-liner at 345 nm for 65 seconds. The upper layer was developed in methylisobutyl ketone for 2 minutes during which time unexposed regions of the film were dissolved away. The patterned upper layer was thoroughly dried by using a high pressure nitrogen gun.

The resulting bilayer plates were wetted with a Ag nanoink DGP40 (Advanced NanoProducts, Seoul, Korea) diluted 1:5 with ethanol. The ink was spin-coated onto the plate at 1000 RPM. The inked plates were then observed in an optical microscope and areas that inked and did not ink were determined. The results showed differential wetting by the hydrophilic silver ink formulation, with the ink residing exclusively in the recessed features of the plate. No ink was observed on the more hydrophobic, upper fluoroalkylated SBS layer of the bilayer plate.

What is claimed is:

1. An article comprising:
   a) a substrate;
   b) a bi-layer having a first layer and a second layer of semi-interpenetrating polymer network layers disposed on the substrate, wherein the first network layer comprises a hydrophobic fluorinated crosslinked polymer and a hydrophobic fluorinated elastomeric polymer; and the second network layer comprises a crosslinked polymer and a elastomeric polymer.

2. The article of claim 1 wherein the hydrophobic fluorinated elastomeric polymer in the first network layer is a block copolymer of styrene-butadiene-styrene or styrene-isoprene-styrene containing hydrophobic fluoroalkyl side groups and the elastomeric polymer in the second network layer is a block copolymer of styrene-butadiene-styrene or styrene-isoprene-styrene.

3. The article of claim 1 wherein the hydrophobic fluorinated elastomeric polymer in the first network layer is a block copolymer of styrene-butadiene-styrene or styrene-isoprene-styrene containing hydrophobic fluoroalkyl side groups and the elastomeric polymer in the second network layer is a block copolymer of styrene-butadiene-styrene or styrene-isoprene-styrene containing hydrophilic hydroxyl side groups.

4. The article of claim 1 wherein the first network layer is adjacent to the substrate.

5. The article of claim 1 wherein the second network layer is adjacent to the substrate.

6. The article of claim 1 wherein the first network layer and the second network layer have an elastic modulus in the range of 10 to 100 MPa.

7. The article of claim 1 wherein the first network layer and the second network layer have an elastic modulus in the range of 20 to 40 MPa.

8. The article of claim 1 wherein the article is a printing element.

9. The article of claim 8 wherein the article is a printing element comprising a pattern of relief features in one of the first network layer or the second network layer wherein the pattern of relief features selectively wets with ink.

10. The article of claim 1 wherein the article is a printing element wherein the first network layer comprises a pattern of relief features and the second network layer forms a floor.

11. The article of claim 1 wherein the article is a printing element wherein the second network layer comprises a pattern of relief features and the first network layer forms a floor.

12. The article of claim 1 wherein the second network layer is hydrophilic.

* * * * *